United States Patent

[11] 3,619,738

[72] Inventor Michio Otsuka
Yokohama, Japan
[21] Appl. No. 80,110
[22] Filed Oct. 12, 1970
[45] Patented Nov. 9, 1971
[73] Assignee Tokyo Shibaura Electric Co., Ltd.
Kawasaki-shi, Japan
[32] Priorities Oct. 13, 1969
[33] Japan
[31] 44/81156; Nov. 7, 1969, Japan, No. 44/88695; Nov. 22, 1969, Japan, No. 44/93364

[54] SEMICONDUCTOR DEVICE WITH IMPROVED CONNECTION TO CONTROL ELECTRODE REGION
8 Claims, 25 Drawing Figs.

[52] U.S. Cl. .......... 317/235, 317/234, 29/576
[51] Int. Cl. .......... H011 5/02
[50] Field of Search .......... 317/234, 235, 237–241

[56] References Cited

UNITED STATES PATENTS

| | | | |
|---|---|---|---|
| 3,474,303 | 10/1969 | Lutz .......... | 317/234 |
| 3,475,235 | 10/1969 | Nawalk et al. .......... | 148/190 |
| 3,476,992 | 11/1969 | Chu .......... | 317/235 |
| 3,480,802 | 11/1969 | Longini .......... | 317/235 X |

*Primary Examiner*—James D. Kallam
*Attorney*—Flynn & Frishauf

ABSTRACT: In a semiconductor device with a control grid and comprising at least three semiconductor layers of alternately different conductivity types, portions of the second layer are protruded through the first layer to be exposed on the surface of the first layer, second electrode is mounted on the exposed portions in ohmic contact therewith, a third electrode is mounted to insulating cover the second electrode and the exposed portions containing the same, and the third electrode is in ohmic contact with the first layer.

SEMICONDUCTOR DEVICE WITH IMPROVED CONNECTION TO CONTROL ELECTRODE REGION

This invention relates to semiconductor device more particularly to improved connection to the control electrode of a semiconductor device with a control electrode or gate electrode.

In a semiconductor device having a control electrode, such as a transistor or a semiconductor-controlled rectifier element (for example thyristor) the lateral resistance of the semiconductor substrate increases with the surface area thereof so that the control effect of the control electrode upon the emitter region or cathode region decreases with the distance from the control electrode. Especially, in the case of a power semiconductor device, as the area of the emitter region or cathode region (hereinafter both regions are designated merely as the emitter region) this problem becomes serious. For this reason, as is well known in the art, for the power semiconductor-controlled rectifier element the control electrode is formed in the shape of an annulus or a comb whereas in the case of the transistor, a modified comb shape or an overlay construction is used, thus improving the arrangement of the control electrode region with respect to the cathode region for the purpose of eliminating the above-described defect. With these prior constructions, however, the relative arrangement between the control electrode (that is the base electrode, in the case of a transistor whereas the gate electrode, in the case of a thyristor) and the emitter electrode (that is the cathode electrode, in the case of the thyristor) is extremely complicated. On the other hand, since the effective value of the main or output current of a semiconductor element with a control electrode is related to the area of the emitter electrode, in the power semiconductor element, it is essential to make as large as possible the area of the emitter electrode. Nevertheless, in the prior art semiconductor devices, as the construction of the leads of the emitter electrode and control electrode has been extremely complicated it has been impossible to increase the area of the control electrode thus rendering difficult to manufacture high-power semiconductor elements. When the area of the gate electrode of a semiconductor-controlled rectifier element is increased, the gate current required to ignite it increases. This problem is also required to be solved. In addition, it is also desired to increase the rate of rise of forward current *di/dt* by concurrently igniting the entire cathode region.

It is the principal object of this invention to provide a new and improved semiconductor device wherein the relative arrangement of the control electrode and emitter electrode is greatly simplified.

A further object of this invention is to provide a grid-controlled semiconductor device wherein the control electrode can effectively control the entire emitter region with simplified relative arrangement of the control electrode and emitter electrode.

Still further object of the invention is to provide a grid-controlled semiconductor element or rectifier element with simplified relative arrangement of the control electrode and emitter electrode wherein the rate of rise of the anode current is increased.

The semiconductor device comprises at least first, second and third semiconductor layers of alternate conductivity type; a first electrode electrically connected to the last layer; the first layer including at least one main region having an area in which portions of the second layer are exposed at the surface level of the first layer; by protruding through the first layer; a second electrode in ohmic contact with the exposed portions of the second layer; and a third electrode overlying the main region of the first layer and insulated from the underlying second electrode and from the exposed portions of the second layer; the third electrode being in ohmic contact with the main region in the first layer so as to cover the second electrode and the exposed portions of the second layer.

The second electrode constitutes a control electrode and the third electrode an emitter electrode. According to this invention, as the emitter electrode is disposed to overly and insulated from the control electrode, these electrodes can be arranged neatly. This arrangement makes it possible to dispose the first semiconductor layer constituting the emitter layer and the second semiconductor layer constituting the control electrode layer in intricated configurations in substantially the same plane. Proper intrication of the emitter region and the control electrode region assures efficient control effect of the control electrode throughout the entire emitter region. This electrode arrangement further increases the areas of the emitter region and of the control electrode region. Thus, this invention can remove prior limitations of the construction of power semiconductor devices.

In this manner, in accordance with this invention, it is possible to provide a transistor having a substrate comprising three semiconductor layers with improved relative arrangement of emitter electrode and the base electrode and to provide a semiconductor-controlled rectifier element having a substrate comprising four semiconductor layers with improved relative arrangement of the gate electrode and the cathode electrode.

According to another feature of this invention there is provided a semiconductor-controlled rectifier element of improved rising rate of the anode current by adding an auxiliary region to the first layer and by properly arranging the auxiliary region, a fourth electrode attached to the second electrode and the main region.

The invention can be more fully understood from the following detailed description taken in conjunction with the accompanying drawings which are depicted with some portions exaggerated. In the Drawings.

Figure 1A:
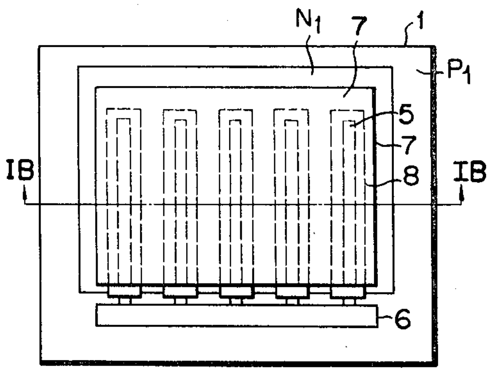
FIG. 1A shows a plan view of a thyristor embodying this invention.
Figure 1B:
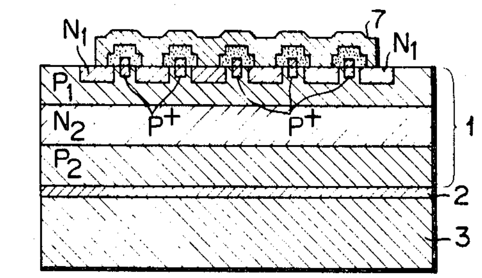
FIG. 1B is a sectional view taken along a line IB–IB—in FIG. 1A.
Figure 1C:
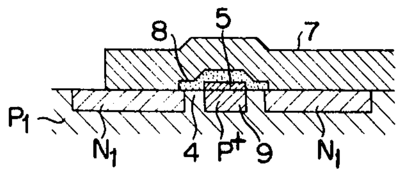
FIG. 1C is an enlarged view of a portion of FIG. 1B.

FIGS. 1A and 1B show a construction of a thyristor having a semiconductor substrate 1 comprising four layers, viz a first layer $N_1$, as second layer $P_1$, a third layer $N_2$ and a fourth layer $P_2$ which have alternately different conductivity types and are laminated one upon the other. A first, or anode electrode 3 is connected to the fourth layer $P_2$ through an aluminum layer 2. The first layer $N_1$ includes a main region having several areas through which portions of the second layer $P_1$ are exposed at the surface of the first layer $N_1$. To these exposed portions 4 is secured a plurality of second or gate electrodes 5 to provide ohmic contacts. As shown in FIG. 1A, a respective ends of the gate electrodes 5 are connected in common to a main gate electrode 6. A third or cathode electrode 7 is provided in ohmic contact with the first layer $N_1$ to overlie respective gate electrodes and exposed portions 4 of the second layer. An insulator film 8 of $SiO_2$, SiO or low-melting glass is applied on two adjacent exposed portions 4 and the gate electrode 5 therebetween, whereby these portions 4 and the gate electrode 5 are electrically insulated from the cathode electrode 7. Thus, the gate electrodes 5 are evenly distributed throughout the first layer $N_1$ and the cathode region in the ducts formed in the cathode electrode 7 and insulated therefrom.

The semiconductor device of the above construction can be fabricated in the following manner, for example. First, an N-type semiconductor substrate is prepared and a trivalent metal, Ga, for instance, is diffused into the opposite surfaces of the substrate as the impurity to prepare a semiconductor substrate having three layers $P_1$, $N_2$ and $P_2$. Then by means of the well-known selective diffusion technique the first layer or $N_1$ layer is formed in the layer $P_1$ as shown in FIG. 1B. In the exposed portions 4 between spaced apart portions of layer $N_1$ are formed $P^+$regions 9 by the well-known diffusion technique for facilitating the ohmic connection to the gate electrodes 5 which are formed on the $P^+$regions by applying suitable metal by vacuum vapor deposition or electroplating. After application of the insulator layers 8 on the exposed portions 4 of layer $N_1$ and the gate electrodes 5 contained therein a metal such as aluminum or gold is vapor deposited to form the cathode electrode 7. An anode electrode 3 of tungsten or molybdenum is secured to the semiconductor layer $P_2$ by alloying method via a thin layer of aluminum 2. The anode electrode 3 also serves as a temperature compensating plate.

In the semiconductor device described above, control voltage is impressed across the gate electrodes 5 and the cathode electrode 7 to control the current (anode current) flowing between the cathode and anode electrodes. As above described, according to this invention, since the gate electrodes 5 are uniformly distributed throughout the entire surface of the cathode region (layer $N_1$) it is possible to uniformly apply for forward bias voltage over the entire area of the cathode region, thus enabling simultaneous ignition of the thyristor over the entire area of the cathode region. This greatly improves the rising rate, that is the *di/dt* characteristics of the anode current and to greatly reduce the turn on time of the thyristor. Thus, it will be noted that, according to this invention, it is quite easy to distribute gate electrodes 5 in the cathode region 7 in an intricated configuration.

It will also be clear that the invention can be worked out in a number of forms as described in the following. In the following modifications the same or corresponding portions are designated by the same reference numerals for the sake of description.

Figure 2A:
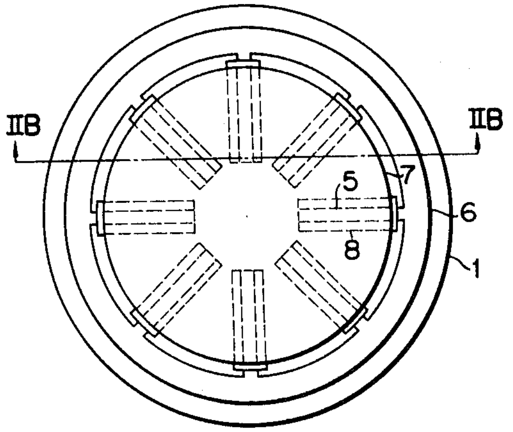
FIG. 2A shows a plan view of a modified thyristor.
Figure 2B:
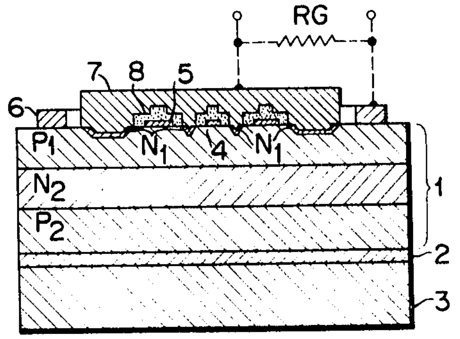
FIG. 2B shows a sectional view taken along a line IIB—IIB in FIG. 2A.

In the modified thyristor shown in FIGS. 2A and 2B, gate electrodes 5 are arranged radially and the common gate electrode 6 in the form of an annulus. This arrangement of the gate electrodes is suitable for the GTO SCR (gate turn off silicon controlled rectifier) whose anode current can be turned off by applying a control potential upon the gate electrodes. A circular disc shaped cathode electrode 7 is provided to cover radially disposed gate electrodes 5, and the radially disposed portions 4 of the layer $P_1$ and the gate electrodes 5 contained therein are insulated from the cathode electrode 7 by insulating layers 8 and the exposed portions 4 are covered by the cathode electrode. Layers $P_1$, $N_2$ and $P_2$ are formed in the same manner as in the previous embodiment. After forming the gate electrodes 5 in the prescribed portions of the second layer $P_1$ the exposed portions of the layer $P_1$ and the gate electrodes formed therein are covered by insulator layers 8 of SiO, $SiO_2$ or low-melting glass and then a metal film of Au-Sb alloy, for example, is alloyed to the layer $P_1$ thus forming the cathode electrode 7 and the emitter region (cathode region) at the same time. When the cathode electrode 7 and the common annular gate electrode 6 are interconnected through a high-resistance resistor $R_g$ of several hundred ohms to several kilohms, as shown in FIG. 2B, sufficiently high short circuited emitter effect can be manifested.

Figure 3:
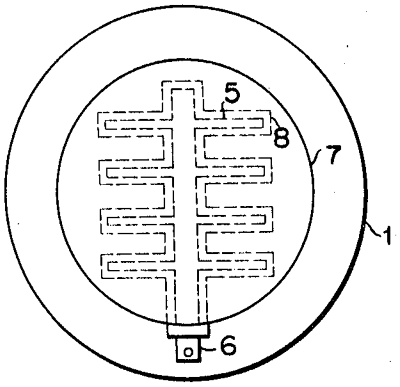
FIGS. 3 and 4 show plan views of other modified thyristors.
Figure 4:
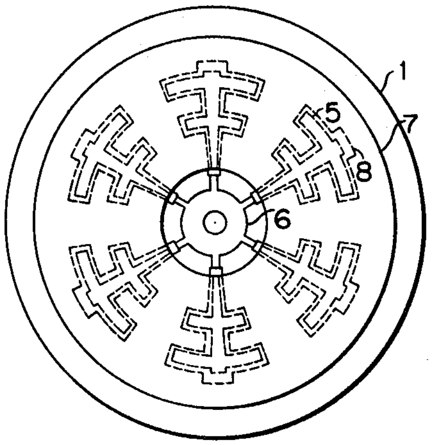

In the embodiment shown in FIG. 3 exposed portions 4 of the second layer $P_1$ and the gate electrodes 5 formed on these portions are parallel with each other and the common gate electrode 6 is positioned on one side of the gate electrodes. This type of thyristor is called side-gate-type thyristor. The sectional configuration is similar to that of the first embodiment. In the fourth embodiment of this invention shown in FIG. 4, a plurality of exposed portions of the layer $P_1$ are formed along a plurality of concentric circles, and a corresponding number of arcuate gate electrodes 5 contained in respective exposed portions are connected to a common gate electrode 6 located at the center of the concentric circles. This type of thyristor is termed as the center gate type thyristor.

Figure 5A:
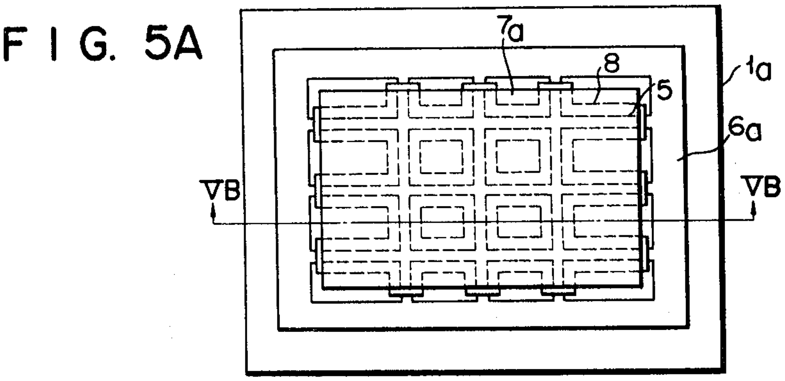
FIG. 5A shows a plan view of a transistor embodying this invention.
Figure 5B:
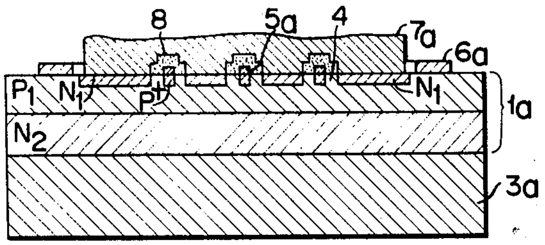
FIG. 5B is a sectional view taken along a line VB—VB in FIG. 5A.

In the fifth embodiment of this invention shown in FIGS. 5A and 5B, the semiconductor substrate 1*a* comprises three layers $N_1$, $P_1$ and $N_2$ and a first electrode or a collector electrode 3*a* is joined to the lower side of the third layer $N_2$. The first layer $N_1$ or the emitter region is formed by any well-known technique such that exposed portions of the second layer $P_1$ or the base region are distributed on the surface of the first layer $N_1$ with a desired pattern. Portions of the base region to which electrodes are to be mounted are converted into $P^+$regions as has been described in connection with the first embodiment and base electrodes 5*a* are formed on these $P^+$regions. The surfaces of the exposed portions 4 and the base electrodes contained therein are covered by insulating layers 8 of $SiO_2$, for example. A third electrode, or an emitter electrode 7*a* is provided to cover electrode 5*a*, in ohmic contact with the first layer $N_1$. As shown in FIG. 5A, the base electrodes 5*a* take a form of a matrix or lattice and are electrically connected to a common base electrode 6*a*. This modified element can be fabricated by a method similar to that of the first embodiment excepting the emitter and base electrodes. The semiconductor element of this embodiment is sealed in an envelope and connected to exterior electrodes by means of solder or slidable contacts such as spring means or the like.

As has been pointed out hereinabove, in conventional thyristors, increased area of the second layer of $P_1$ layer or the control region requires larger control current. It is also desired to increase the *di/dt* characteristic. main According to this invention, the first layer is divided into a main region and an auxiliary region, the gate electrodes provided in the portions of the second layer exposed in the main region are electrically connected to the auxiliary region. A main gate electrode is formed on the second layer such that the auxiliary region is positioned between the main gate electrode and the main region whereby to provide a thyristor manifesting improved *di/dt* characteristic with small control current.

Figure 6A:
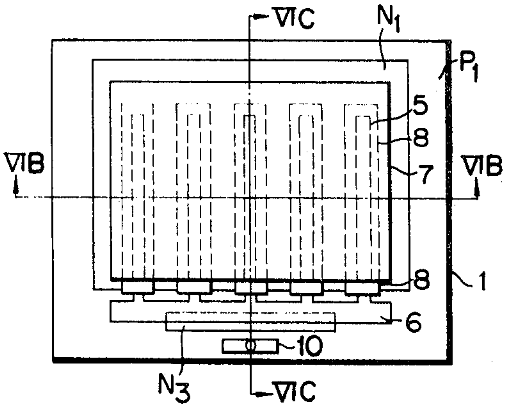
FIG. 6A shows a plan view of a thyristor wherein the first layer of the semiconductor substrate comprises a main region and an auxiliary region separated from the main region.
Figure 6B:
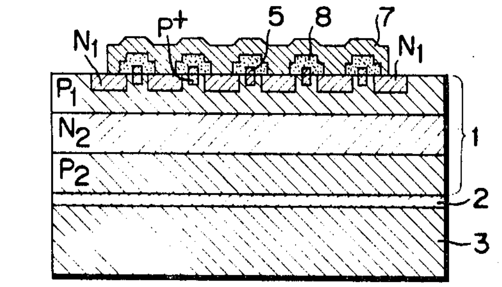
FIG. 6B shows a section of the thyristor shown in FIG. 6A taken along a line VIB—VIB.
Figure 6C:
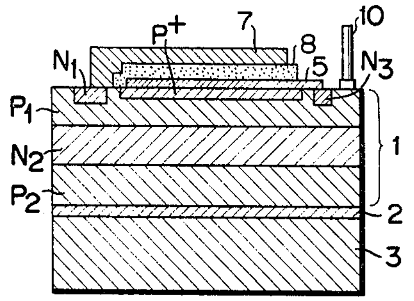
FIG. 6C shows a section taken along a line VIC—VIC in FIG. 6A.

FIGS. 6A and 6B illustrate the construction of a thyristor of this type. The semiconductor substrate 1 of this thyristor is comprised by four laminated layers $N_1$, $P_1$, $N_2$ and $P_2$ in the same manner as in the first embodiment. However, as shown in FIG. 6A the first layer comprises a main region $N_1$ and an auxiliary region $N_3$ which are separated from each other. The first to fourth layers are formed in the same manner as in the first embodiment. Further, as shown in FIGS. 6A to 6C, the relationship among the gate electrodes 5, insulators 8, cathode electrode 7, regions $P_1$, regions $N_1$ and the common electrode 6 in the main region is the same as in the first embodiment.

However, a main gate electrode 10 is formed on the exposed portion of the second layer $P_1$ adjacent the auxiliary region $N_3$ by ultrasonic-welding technique, for example. The auxiliary region $N_3$ is positioned between the main region $N_1$ and the main electrode 10 as shown in FIGS. 6A and 6C. Respective gate electrodes 5 are electrically connected to the auxiliary region $N_3$.

In operation, the thyristor of this embodiment is biased forwardly. In other words, a voltage is applied such that the anode electrode is biased positively and the cathode electrode negatively. Further, a source of control voltage is connected between the main gate electrode 10 and the cathode electrode 7 such that the main gate electrode 10 is biased positively. Then the gate current flows through a passage which can be traced through main gate electrode 10, region $P_1$, region $N_3$, gate electrodes 5, region $P^1$, region $P_1$, region $N_1$ and main region $N_1$ occur simultaneously. However, as the density of electrons injected from the auxiliary region $N_3$ is much higher than that of the electrons from the main region $N_1$, at first, portions of four layers $N_3$, $P_1$, $N_2$ and $P_2$ confronting the auxiliary region $N_3$ are ignited. This ignition current flows through a passage through the gate electrodes 5, $P^+$ region, $P_1$ regions, cathode region $N_1$ and cathode 7 so that the entire main region $N_1$ (cathode region) is uniformly and strongly biased forwardly, with the result that substantially the entire surface of the first layer (cathode region) is uniformly ignited. For this reason it is possible to decrease the gate current. Even with such a small gate current it is possible to greatly decrease the rising period of the anode current (the current flowing through electrodes 3 and 7), thus greatly improving the *di/dt* characteristics of the thyristor. When the thyristor are manufactured with their resistances between gate electrodes 5 and the main cathode region (layer $N_1$) equal to several ohms to several hundred ohms it is possible to maximize the *di/dt* characteristic, for example from 800 A./$\mu$s to 1000 A./$\mu$s.

With this construction, since gate electrodes 5 are distributed in an area beneath the cathode electrode 7, when the cathode region and gate regions are interconnected through a resistor having a resistance value of several hundreds to several kilohms, sufficiently high short circuited emitter effect can be provided.

Figure 7A:
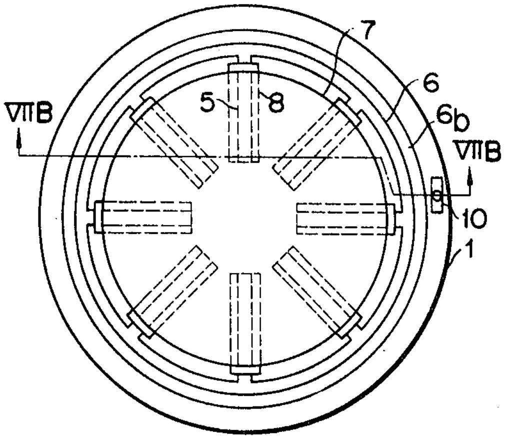
FIG. 7A shows a plan view of a modification of the thyristor shown in FIG. 6.
Figure 7B:
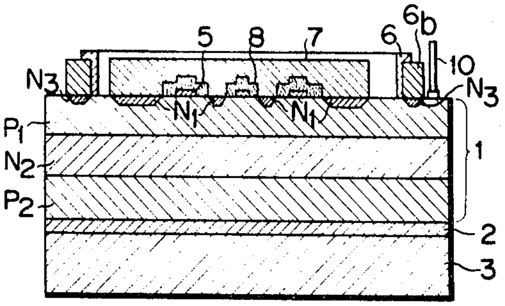
FIG. 7B shows a sectional view of the thyristor shown in FIG. 7A taken along a line VIIB—VIIB.

FIGS. 7A and 7B show a modification of the thyristor shown in FIGS. 6A to 6C. In this embodiment gate electrodes 5 are formed in the axial direction and a common annular gate electrode 6 connected to the outer ends of the gate electrode is electrically connected to an annular auxiliary region $N_3$ through an annular electrode 6*b*. Gate electrodes 5 formed in the exposed portions of the layer $P_1$ in the main region as well as these exposed portions are electrically insulated from overlying cathode electrode 7. Regions $N_1$ and $N_3$ are formed by alloying or diffusion process. More particularly, the $N_1$ region and cathode electrode 7 are formed simultaneously by a method comprising the steps of forming gate electrodes 5 on the prescribed portions of layer $P_1$, applying insulator films of SiO, $SiO_2$ low-melting glass on the exposed portions of the layer $P_1$ and gate electrodes 5 contained therein, and then alloying a foil of Au-Sb, for example, on the predetermined area of the layer $P_1$. The thyristor of this embodiment functions with the same advantages as the embodiment shown in FIGS. 6A to 6C.

Figure 8:
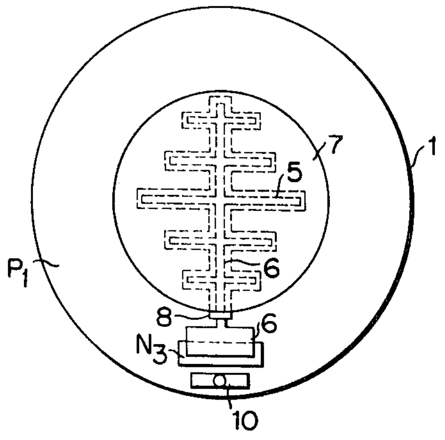
FIG. 8 is a plan view of another modified thyristor.

FIG. 8 shows a modified embodiment of the thyristor shown in FIGS. 6A to 6C. This modification is of the side-gate type wherein a main gate electrode 10 and an auxiliary region $N_3$ are formed at a portion near the periphery of the substrate 1. The relative arrangement between the gate electrodes 5 and the cathode electrode 7, when viewed in a sectional view, is similar to that of the embodiment shown in FIGS. 6A to 6C except that a common gate electrode 6 for respective parallel gate electrodes 5 intersects at right angles the central portions thereof.

Figure 9:
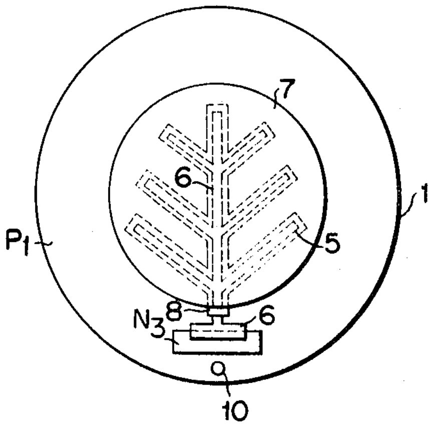
FIG. 9 is a plan view of still another modified thyristor.

FIG. 9 shows a further modification of the side-gate-type thyristor shown in FIG. 8. This embodiment is different from that shown in FIG. 8 only in that the gate electrodes 5 intersect the common gate electrode 6 in the form of symmetrical branches of a tree and that a main gate electrode 10 of a small area is formed on the layer $P_1$.

Figure 10A:
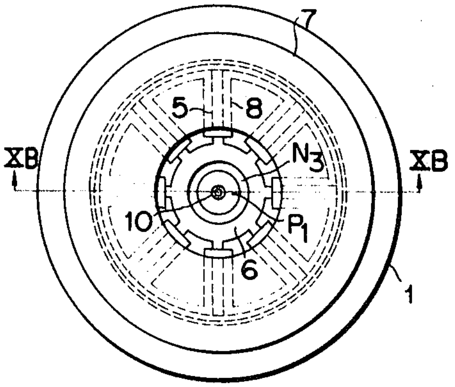
FIG. 10A is a plan view of further modified thyristor.
Figure 10B:
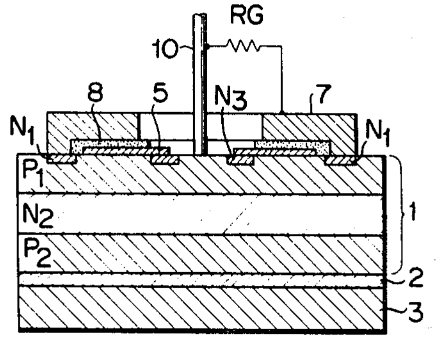
FIG. 10B shows a section thereof taken along a line XB—XB in FIG. 10A.

FIGS. 10A and 10B show a center-gate-type thyristor. In this embodiment, the main region $N_1$ is in the form of a circular annulus and an independent auxiliary region $N_3$ is disposed at the center of the main region $N_1$. A main gate electrode 10 is formed on the region $P_1$ at the center of the auxiliary region $N_3$. Like the embodiment shown in FIG. 7, gate electrodes 5 are disposed radially and their annular common gate electrode 6 is disposed at the center of a circular disc-shaped substrate 1. This embodiment is characterized in that it is easy to interconnect the main gate electrode 10 and the cathode electrode 7 through a resistor of a value of several hundred ohms to several kilohms thus obtaining the desired short circuited emitter effect.

Figure 11A:
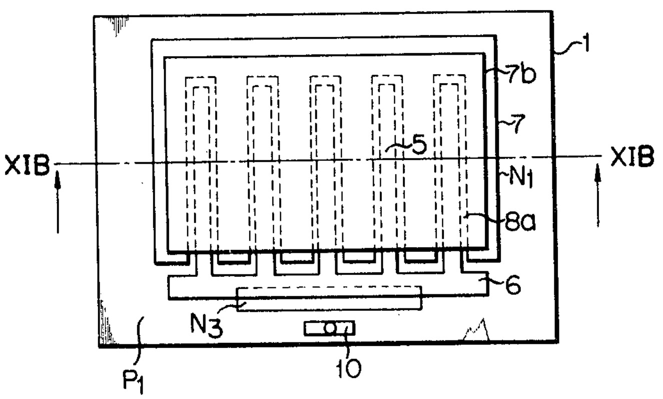
FIG. 11A shows a plan view of still another form of a thyristor embodying the invention.
Figure 11B:
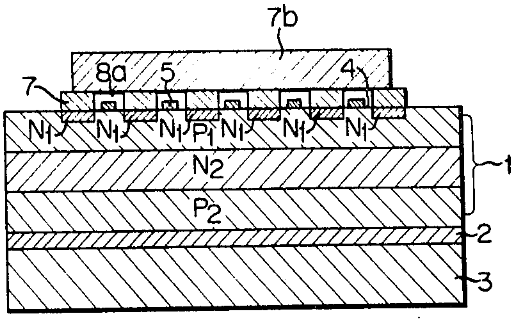
FIG. 11B shows a sectional view taken along a line XIB—XIB in FIG. 11A.

FIGS. 11A and 11B show still further modification of the thyristor shown in FIGS. 6A to 6C. It differs from that shown in FIGS. 6A to 6C in that the cathode electrode comprises two unitary portions 7 and 7*b* and that the exposed portions 4 of the layer $P_1$ and gate electrode 5 contained in these exposed portions are insulated from the cathode electrode by airgaps 8*a*. More in detail, gate electrodes 5 are formed on the exposed portions 4 of the layer $P_1$ and portions 7 of the cathode of Au, Al or the like are formed on the $N_1$ region. The height of portions 7 is made larger than that of the gate electrodes 5 and a combined temperature-compensating plate and cathode plate 7*b* of tungsten or molybdenum is slidably urged against cathode electrode portions 7 or soldered thereto. When so constructed, the exposed portions 4 of layer $P_1$ and gate electrodes 5 contained therein are insulated from the cathode structure by airgaps 8*a*.

While in the embodiment shown in FIGS. 6A to 6C a construction of a thyristor was shown wherein the first layer was divided into separated main and auxiliary regions so as to improve the *di/dt* characteristic with smaller control current, the same advantage as well as sufficiently large short circuited emitter effect can also be provided by merely dividing the first layer into contiguous main and auxiliary zones.

Figure 12A:
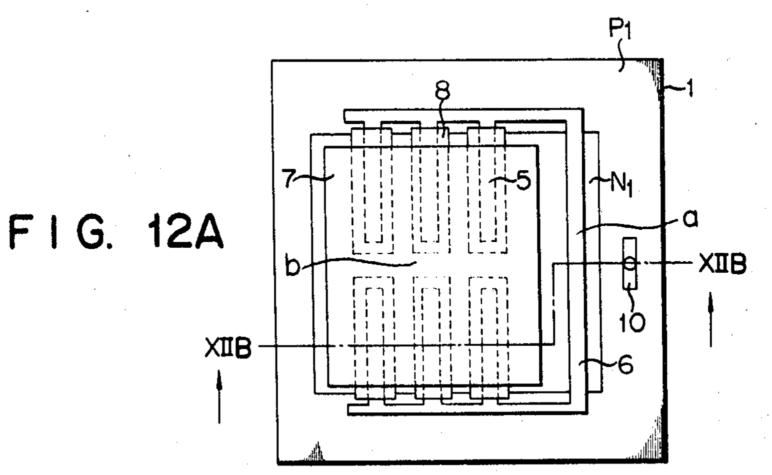
FIG. 12A shows a modified thyristor in which the first layer of the semiconductor substrate comprises an main region and an auxiliary region contiguous with the main region.
Figure 12B:
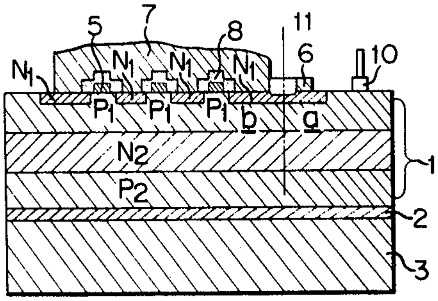
FIG. 12B shows a section of the thyristor shown in FIG. 12A taken along a line XIIB—XIIB.

One example of such a construction of the thyristor is illustrated in FIGS. 12A and 12B. In the construction shown in FIGS. 12A and 12B, the semiconductor substrate 1 including the second to fourth layers $P_1$, $N_2$ and $P_2$, gate electrodes 5, and cathode electrode 7 are fabricated in the same manner as in the embodiment shown in FIGS. 6A to 6C.

As shown in FIG. 12B, portions of the first layer $N_1$ to the left of a dash and dot line 11 constitute the main region *b* whereas portions to the right constitute the auxiliary region *a*. The gate electrodes 5 are formed on the exposed portions of the layer $P_1$ in the main region *b* whereas an electrode 6 common to these gate electrodes 5 is electrically connected onto the surface of the layer $N_1$ in the auxiliary region *a*. In other words, the gate electrodes 5 are in the form of stripes on a common plane, as shown in FIG. 12A. The thickness of the layer $N_1$ at portions between main and auxiliary regions *b* and *a* and including the dot and dash line is thinner than that of the other portion. In the main region *b*, the exposed portions of layer $P_1$ and the gate electrodes 5 contained therein are covered by insulator layers 8 and the cathode electrode 7 is in ohmic contact with the layer $N_1$ in the main region *b* thus covering exposed portions and gate electrodes. The main gate electrode 10 is secured to the layer $P_1$ at a portion close to one side of layer $N_1$. A combined heat-compensating plate and anode electrode 3 made of tungsten or molybdenum is alloyed to the bottom of layer $P_2$ through a foil of aluminum or the like 2. In some case, it is advantageous to decrease the thickness of layer $N_1$ so that portions thereof underlying the cathode electrode 7 may have suitable resistance value, for example from several ohms to several kilohms.

In operation, a forward bias is applied across anode electrode 3 and cathode electrode 7, making the former positive and the latter negative, and a source of control potential is connected between the main gate electrode 10 and the cathode electrode 7, biasing positively the main gate electrode 10 with respect to the cathode electrode 7. Then, the gate current will flow from the main gate electrode 13 to the cathode electrode 7 through region $P_1$ and region $N_1$ divided by dot and dash line 11. Consequently, carriers are firstly injected into confronting portions of four layers $N_1$, $P_1$, $N_2$ and $P_2$ of the auxiliary region *a*, thus igniting these portions. A portion of the ignition current flows into the cathode electrode 7 directly through the portion of the layer $N_1$ close to the ignited portions and the remaining portions of the ignition current flow from gate electrodes 5 in the form of stripes to the cathode electrode 7 via $P_1$ region, and $N_1$ or the main region, thus forwardly biasing the entire cathode regions confronting the main region *b*. Thus, immediately after ignition of the four layer portions of the auxiliary region *a*, the four layer portions of the main region *b* are ignited. When the resistance of the layer $N_1$ between the common gate electrode 6 and the cathode electrode 7 is selected to a suitable value it is possible to minimize the time interval or time delay between ignitions of the auxiliary region *a* and of the main region *b*. This decreases the buildup time of the main anode current and hence improving the *di/dt* characteristic of the thyristor even with small gate current. When the resistance value of the layer $N_1$ between the gate electrodes 5 and cathode electrode 7 is controlled from several ohms to several hundred kilohms it is possible to manufacture thyristors having improved *di/dt* characteristics of from 800 A./μs to 1000 A./μs.

This embodiment is characterized in that layers $P_1$ and $N_1$ in the main region *b* are short circuited by the resistance in the layer $N_1$ bridging the auxiliary region *a* and the main region *b* thus providing sufficiently high short circuited emitter effect without employing any additional resistor.

Figure 13:
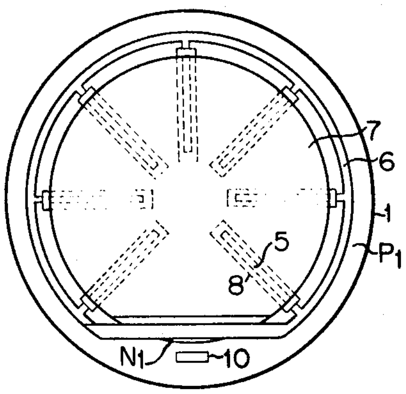
FIG. 13 is a plan view of a modification of the thyristor shown in FIGS. 12A and 12B.

FIG. 13 shows a modification of the thyristor shown in FIGS. 12A and 12B. This embodiment is different from that shown in FIGS. 12A and 12B in that the gate electrodes 5 are arranged in the radial direction with their outer ends connected to the annular common gate electrode 6. The area underlying the cathode electrode 7 serves as the main region and the relationship between the gate electrodes 5 and the cathode electrode 7 is the same as that of the former embodiment, when viewed in a sectional view. Layer $N_1$ shown close to the main gate electrode 10 represents the auxiliary region.

Figure 14:
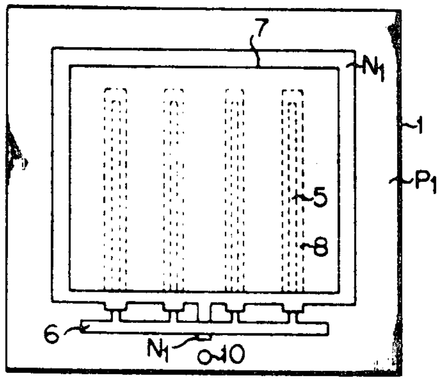
FIG. 14 shows a plan view of a modification of the thyristor shown in FIGS. 12A and 12B.

FIG. 14 shows a plan view of a further modification of the embodiment shown in FIGS. 12A and 12B. This embodiment is different from the former embodiment in that gate electrodes 5 are arranged in parallel with each other and at right angles with respect to the common gate electrode 6, that the area underlying the cathode electrode 7 constitutes the main region and that the auxiliary region of the layer $N_1$ is closely adjacent to the common gate electrode 6.

Figure 15:
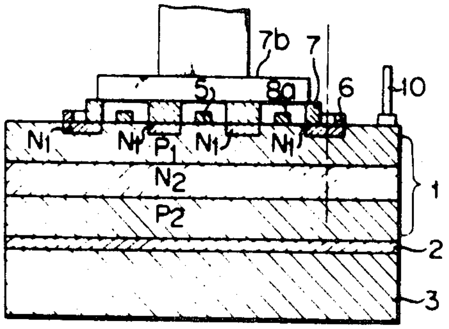
FIG. 15 is a plan view of a yet another modification of the thyristor shown in FIGS. 12A and 12B.

FIG. 15 shows a modification of the thyristor shown in FIGS. 12A and 12B. In this embodiment, the height of the cathode electrodes 7 in the main region to the left of dot and dash line 11 which divides the first layer is made higher than the height of the gate electrodes 5 and a temperature-compensating plate 7*b* is slidably urged against or soldered to the cathode electrode 7, thus forming airgaps 8*a* above gate electrodes 5. With this construction, the thickness of the layer $N_1$ divided by border line 11 into the main and auxiliary regions is uniform, so that this embodiment operates in the same manner as that shown in FIGS. 12A and 12B.

Thus, it will be clear that this invention provides a power transistor and controlled rectifier element wherein portions of the second layer are protruded through the first layer to be exposed at the surface thereof, second electrodes are formed on these exposed portions and the exposed portions and the second electrodes contained therein are insulatingly covered by a third electrode. For this reason, it is possible to neatly arrange the second and third electrodes in spite of intricated configurations, thus eliminating problems encountered in the prior grid-controlled semiconductor devices.

What is claimed is:

1. A semiconductor device comprising a substrate including at least first, second and third semiconductor layers having alternately different conductivity types and laminated one upon the other, a third electrode connected to said first layer, a second electrode connected to said second layer and a means including a first electrode connected to the last of said layers, said first layer including at least one main region, portions of said second layer protruding through said first layer to be exposed at the surface thereof, said second electrode being in ohmic contact with said exposed portions of said second layer, said third electrode overlying said exposed portions of said second layer and said second electrode mounted on said portions and insulated from said exposed portions and said second electrode, and said third electrode being in ohmic contact with said first layer in said main region.

2. A semiconductor device according to claim 1 wherein said first layer includes an auxiliary region separated from said main region, said second electrode in said main region is electrically connected with said auxiliary region, and a fourth electrode is connected to the exposed portion of said second layer at a position separated from said main region by said auxiliary region.

3. A semiconductor device according to claim 1 wherein said first layer includes an auxiliary region contiguous with said main region, said second electrode in said main region is electrically connected to said auxiliary region and a fourth electrode is connected to the exposed portion of said second layer at a position separated from said main region by said auxiliary region.

4. A semiconductor device according to claim 1 wherein said exposed portions of said second layer in said main region are in the form of parallel stripes and said third electrode covers all of said stripes.

5. A semiconductor device according to claim 1 wherein the first, second and the third semiconductor layers of alternately different conductivity types are laminated one upon the other, said first electrode comprises a collector electrode, said second electrode a base electrode and said third electrode an emitter electrode whereby constituting a transistor.

6. A semiconductor device according to claim 1 wherein first to fourth semiconductor layers having alternately different conductivity types are laminated one upon the other, said first electrode comprises an anode electrode, said second electrode a gate electrode, and said third electrode a cathode electrode whereby constituting a semiconductor-controlled rectifier element of the four layer construction.

7. A semiconductor device according to claim 3 wherein the thickness of said first layer near the boundary between said main region and said auxiliary region is made thinner than the remaining portions of said first layer.

8. A semiconductor device according to claim 1 wherein said means including said first electrode includes a semiconductor layer interposed between said first electrode and the last of said first, second and third layers.

* * * * *